US012598926B2

(12) United States Patent
Akiyama et al.

(10) Patent No.: US 12,598,926 B2
(45) Date of Patent: Apr. 7, 2026

(54) METHOD OF FORMING CONDUCTIVE MEMBER AND METHOD OF FORMING CHANNEL

(71) Applicant: Tokyo Electron Limited, Tokyo (JP)

(72) Inventors: Koji Akiyama, Nirasaki City (JP);
Chihiro Tamura, Taiwacho (JP);
Hisashi Warashina, Taiwacho (JP)

(73) Assignee: Tokyo Electron Limited, Tokyo (JP)

( * ) Notice: Subject to any disclaimer, the term of this patent is extended or adjusted under 35 U.S.C. 154(b) by 746 days.

(21) Appl. No.: 17/932,800

(22) Filed: Sep. 16, 2022

(65) Prior Publication Data

US 2023/0086545 A1 Mar. 23, 2023

(30) Foreign Application Priority Data

Sep. 22, 2021 (JP) ................................. 2021-154079

(51) Int. Cl.
*H01L 21/228* (2006.01)
*C30B 1/02* (2006.01)
(Continued)

(52) U.S. Cl.
CPC ............ *H01L 21/228* (2013.01); *C30B 1/023* (2013.01); *C30B 1/10* (2013.01); *C30B 29/52* (2013.01);
(Continued)

(58) Field of Classification Search
CPC ........... C30B 1/023; C30B 1/10; C30B 29/52; H01L 21/0245; H01L 21/02488;
(Continued)

(56) References Cited

U.S. PATENT DOCUMENTS

2010/0213550 A1* 8/2010 Kanno ................... H10B 63/80
257/E27.07
2010/0237272 A1 9/2010 Chaudhari et al.
2015/0263201 A1 9/2015 Chaudhari et al.

FOREIGN PATENT DOCUMENTS

JP 2013522160 A 6/2013
JP 2015-509661 A 3/2015
(Continued)

OTHER PUBLICATIONS

Oliver Nast; Andreas J. Hartmann, "Influence of interface and Al structure on layer exchange during aluminum-induced crystallization of amorphous silicon", J. Appl. Phys. 88, 716-724 (Year: 2000).*

(Continued)

*Primary Examiner* — Hua Qi
(74) *Attorney, Agent, or Firm* — Armstrong Teasdale LLP

(57) ABSTRACT

A method of forming conductive member includes: forming, on substrate, first portion containing first element constituting the conductive member to be obtained and second element causing eutectic reaction with the first element, and second portion containing third element constituting intermetallic compound with the second element; crystallizing primary crystals of the first element by adjusting temperature of the substrate after bringing the first portion into liquid phase state; growing crystal grains of the first element by diffusing the second element from the first portion into the second portion to increase ratio of the first element in crystal state to the first and second elements in the liquid phase state in the first portion while maintaining the temperature of the substrate at the same temperature; and turning the first portion, after completing diffusion of the second element into the second portion, into the conductive member having crystal grains of the first element.

14 Claims, 8 Drawing Sheets

(51) Int. Cl.
    *C30B 1/10*         (2006.01)
    *C30B 29/52*      (2006.01)
    *H01L 21/02*      (2006.01)

(52) U.S. Cl.
    CPC .... *H01L 21/0245* (2013.01); *H01L 21/02532*
        (2013.01); *H01L 21/02634* (2013.01); *H01L*
        *21/02658* (2013.01); *H01L 21/02488* (2013.01)

(58) Field of Classification Search
    CPC ......... H01L 21/02532; H01L 21/02579; H01L
             21/02634; H01L 21/02658; H01L
             21/02672; H01L 21/2251; H01L 21/228
    See application file for complete search history.

(56) References Cited

FOREIGN PATENT DOCUMENTS

| | | | | |
|---|---|---|---|---|
| JP | 2017-076661 A | 4/2017 | | |
| KR | 10-2002-0002519 A | 1/2002 | | |
| KR | 10-2003-0017690 A | 3/2003 | | |
| KR | 20030017690 A | * | 3/2003 | ............. H10F 71/00 |
| KR | 10-2004-0080895 A | 9/2004 | | |

OTHER PUBLICATIONS

Oliver Nast; Tom Puzzer; Linda M. Koschier; Alistair B. Sproul; Stuart R. Wenham, "Aluminum-induced crystallization of amorphous silicon on glass substrates above and below the eutectic temperature", Appl. Phys. Lett. 73, 3214-3216 (Year: 1998).*

M. Gjukic; M. Buschbeck; R. Lechner; M. Stutzmann, "Aluminum-induced crystallization of amorphous silicon-germanium thin films", Appl. Phys. Lett. 85, 2134-2136 (Year: 2004).*

S. Gaudet; C. Detavernier; A. J. Kellock; P. Desjardins; C. Lavoie, "Thin film reaction of transition metals with germanium", J. Vac. Sci. Technol. A 24, 474-485 (Year: 2006).*

Miyagawa et al., "Metal-Assisted Solid-Phase Crystallization Process for Vertical Monocrysalline Si Channel in 3D Flash Memory", 2019 IEEE International Electron Devices Meeting (IEDM), 2019, pp. 28.3.1-28.3.4, https://doi.org/10.1109/IEDM19573.2019.8993556>.

Nast et al., "Aluminum-induced crystallization of amorphous silicon on glass substrates above and below the eutectic temperature", Applied Physics Letters, Nov. 30, 1998, vol. 73, No. 22, 3 pages.

* cited by examiner

FIG. 1

| | |
|---|---|
| TiN | ~4a |
| Ti | ~3 (12) |
| TiN | ~4 |
| Al | ~2 |
| Si | ~1 (11) |
| SiO₂ | ~10 |

FIG. 4

CaTCalc

FIG. 5

CaTCalc

Temperature (C)

LIQUID

LIQUID+DIAMOND_A4

$S_1$ $l_1$    $C_1$ t1

DIAMOND_A4+FCC_A1

Mole fraction Si

SiO$_2$    ～10

Solid-Phase Epitaxial Growth

FIG. 10

| | |
|---|---|
| TiN | ~4a |
| | ~32 |
| Ti – Al | |
| TiN | ~4 |
| SiGe | ~61 |
| SiO$_2$ | ~10 |

51~

METHOD OF FORMING CONDUCTIVE MEMBER AND METHOD OF FORMING CHANNEL

CROSS-REFERENCE TO RELATED APPLICATION

This application is based upon and claims the benefit of priority from Japanese Patent Application No. 2021-154079, filed on Sep. 22, 2021, the entire contents of which are incorporated herein by reference.

TECHNICAL FIELD

The present disclosure relates to a method of forming a conductive member and a method of forming a channel.

BACKGROUND

For example, in a semiconductor device using polycrystalline silicon for a channel, carriers responsible for on-current are scattered by grain boundaries. Such scattering by the grain boundaries increases channel resistance and lowers a current value. Therefore, attempts have been made to reduce the grain boundaries, which are the scattering sources of carriers, by enlarging a grain size of polycrystalline silicon used for a channel.

For example, Non-Patent Document 1 discloses a technique of enlarging a grain size of a polysilicon channel in a 3D flash memory by a metal induced lateral crystallization method (MILC) using a Ni catalyst.

PRIOR ART DOCUMENT

Non-Patent Document

Hidenori Miyagawa et al., "Metal-Assisted Solid-Phase Crystallization Process for Vertical Monocrystalline Si Channel in 3D Flash Memory," Published in: 2019 IEEE International Electron Devices Meeting (IEDM)<URL: https://doi.org/10.1109/IEDM19573.2019.8993556>

SUMMARY

According to an embodiment of the present disclosure, there is provided a method of forming a conductive member, the method including: forming, on a substrate, a first portion containing a first element, which constitutes a conductive member to be obtained, and a second element, which causes an eutectic reaction with the first element, and a second portion containing a third element, which constitutes an intermetallic compound with the second element; crystallizing primary crystals of the first element by adjusting a temperature of the substrate after bringing the first portion into a liquid phase state; growing crystal grains of the first element by diffusing the second element from the first portion into the second portion to increase a ratio of the first element in a crystal state to the first element and the second element in the liquid phase state in the first portion while maintaining the temperature of the substrate at a same temperature; and turning the first portion, after the diffusion of the second element into the second portion is completed, into the conductive member having the crystal grains of the first element.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a cross-sectional view illustrating an example of a structure used in a method of forming a conductive member according to a first embodiment of the present disclosure.

FIG. 4 is a binary state diagram of Si—Al for explaining mechanism of crystal growth of Si in a case where the first element is Si and the second element is Al.

FIG. 5 is a binary state diagram of Si—Al for explaining a case where Si is crystal-grown in a cooling process from a liquid phase temperature in a Si—Al system.

FIG. 6 is a cross-sectional view illustrating a state in which a portion above the conductive member is removed from the structure of FIG. 3.

FIG. 10 is a cross-sectional view illustrating a conductive member having large crystal grains containing the first element and the fourth element and obtained by outwardly diffusing the second element from the first portion in the structure of FIG. 8.

DETAILED DESCRIPTION

Figure 2:
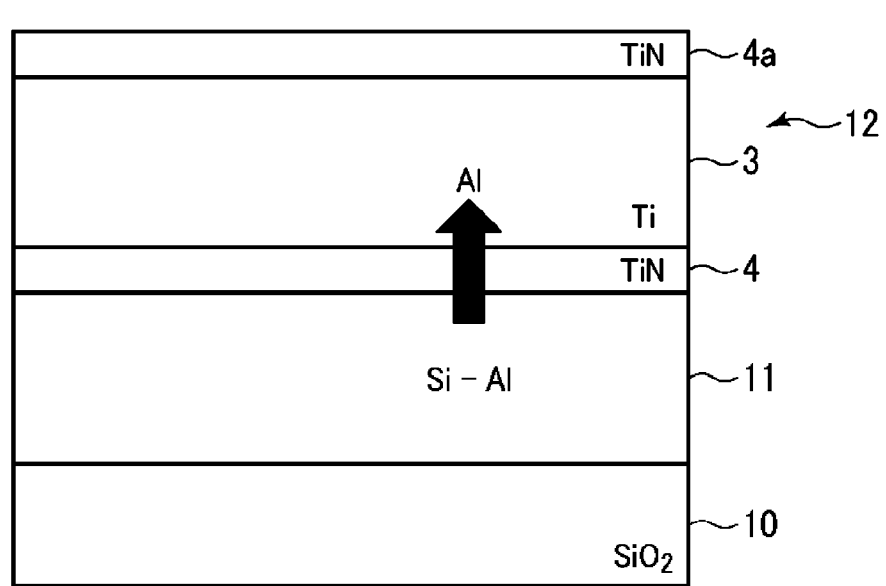
FIG. 2 is a cross-sectional view illustrating a state in which a phase of a first portion of the structure of FIG. 1 is a liquid phase.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the accompanying drawings.

<Background and Outline>

When polycrystalline conductors such as polycrystalline silicon are used in applications that require high carrier mobility, such as channels in semiconductor devices, increasing a crystal grain size has been studied in the related art to reduce grain boundaries, which are the scattering sources of carriers. As a technique of increasing the crystal grain size, a technique of growing only nuclei (primary crystals) is well known in which the crystallization of precipitated nuclei, which are the sources of crystals, is limited from the amorphous state of the solid phase to reduce the number of precipitated nuclei and only the precipitated nuclei crystallized earlier (primary crystals) are grown by slow cooling.

When such a method is used in a semiconductor manufacturing process, elaborate and precise temperature control in a substrate (wafer) plane is required, but it is practically impossible to control the slow cooling uniformly in the substrate plane at the same cooling rate. In addition, in the case where nucleation is performed from the liquid phase, when a system composed of two components or multiple elements is used to lower the melting point, the system is turned into solid-liquid two-phase during the cooling process, and when latent heat is exhausted at the solid-liquid interfaces, crystals may be grown into dendrites (dendritic crystals), and other components remain among the dendrites. Therefore, it is difficult to obtain flat crystals having a uniform composition.

Therefore, in an aspect, crystal growth is carried out in an isothermal process. That is, a first portion containing a first element, which constitutes a conductive member to be obtained, and a second element that causes an eutectic reaction with the first element, and a second portion containing a third element, which forms an intermetallic compound with the second element, and into which the second element may be diffused from the first portion, are formed on a substrate. Then, after the first portion is brought into a liquid phase state, the temperature of the substrate is adjusted to precipitate the primary crystals of the first element, and while the temperature is maintained, the second element is diffused from the first portion into the second portion to increase a ratio of the first element in a crystal state to the first element and the second element in the liquid phase state in the first portion and to grow the crystal grains of the first element. Then, the first portion after the diffusion of the second element into the second portion is completed is used as a conductive member having crystal grains having a large grain size. Thus, the slow cooling rate may not be controlled in the substrate plane, such that the elaborate and precise temperature control may not be performed. Therefore, even in a case where there is a non-uniformity in temperature in the substrate plane, it is possible to enlarge the grain size of crystal grains with excellent controllability. Furthermore, it is possible to easily form a conductive member having the enlarged grain size without using a special method.

Specific Embodiments

Hereinafter, specific embodiments will be described.

First Embodiment

FIG. 1 is a cross-sectional view illustrating an example of a structure used in a method of forming a conductive member according to a first embodiment of the present disclosure.

As illustrated in FIG. 1, first, a conductive layer 1 made of a first element, which constitutes a conductive member to be obtained, is formed on a substrate via an insulating film 10 made of $SiO_2$ or the like, and a metal layer 2 made of a second element, which causes an eutectic reaction with the first element, is formed on the conductive layer 1. The conductive layer 1 and the metal layer 2 form a first portion 11 containing the first element and the second element. Then, an intermetallic compound formation layer 3 containing a third element that forms an intermetallic compound with the second element is formed on the metal layer 2 via a barrier layer 4. The intermetallic compound formation layer 3 is constituted as a second portion 12 into which the second element may be diffused from the first portion 11.

The barrier layer 4 is a layer that serves as a barrier for the second element, and has a function of suppressing and controlling the diffusion of the second element into the second portion 12 (the intermetallic compound formation layer 3). In the example of FIG. 1, a barrier layer 4a having a function of suppressing the diffusion of elements to the upper layer is formed on the intermetallic compound formation layer 3. The barrier layer 4a may be made of the same material as the barrier layer 4.

The conductive layer 1, the metal layer 2, the intermetallic compound formation layer 3, and the barrier layers 4 and 4a are formed by thin film-forming techniques such as CVD, ALD, and PVD.

The first element, which constitutes the conductive layer 1, is turned into a conductive member to be formed, and for example, silicon (Si) or germanium (Ge), which are semiconductor materials, may be used. As described above, the metal layer 2 is made of the second element that causes the eutectic reaction with the first element. That is, the second element satisfies the following Equation (1) with respect to the first element.

$$E_{12}-(E_{11}+E_{22}/2)>0 \tag{1}$$

Here, $E_{12}$ is a bond energy between the first element and the second element, $E_{11}$ is a bond energy between the first elements, and $E_{22}$ is a bond energy between the second elements. In Equation (1), the bond energy between the first element and the second element is higher than an average value of the bond energy between the first elements and the bond energy between the second elements, such that the first element and the second element are repulsive. A solid solubility limit of the second element with respect to the first element may be less than 1 mol %.

The film thickness of each of the conductive layer 1 and the metal layer 2 is adjusted such that, when these layers are melted and the first element and the second element reach a liquidus temperature from the liquid phase state, the composition is adjusted so that the first element is precipitated as primary crystals.

In addition, as described above, the intermetallic compound formation layer 3 contains the third element that forms the intermetallic compound with the second element. That is, the third element satisfies the following Equation (2) with respect to the second element.

$$E_{23}-(E_{22}+E_{33}/2)<0 \tag{2}$$

Here, $E_{23}$ is a bond energy between the second element and the third element, $E_{22}$ is a bond energy between the second elements, and $E_{33}$ is a bond energy between the third elements. That is, the bond energy between the second element and the third element is higher than an average value of the bond energy between the second elements and the bond energy between the third elements, such that the second element and the third element tend to attract each other.

When the first element is Si, for example, aluminum (Al) may be used as the second element. When the second element is Al, for example, titanium (Ti) may be used as the third element, which constitutes the intermetallic compound formation layer 3, and the material, which constitutes the barrier layers 4 and 4a, may be, for example, titanium nitride (TiN).

When the first element is Ge, the second element may be, for example, tin (Sn). In addition, when the second element is Sn, the third element may be, for example, Ti, and the material, which constitutes the barrier layers 4 and 4a, may be, for example, TiN.

In the present embodiment, the temperature at which the first element and the second element are in the liquid phase is set, and as illustrated in FIG. 2, the conductive layer 1 and the metal layer 2 are melted to bring the first portion 11 into the liquid phase state, then the process temperature (the temperature of the substrate) is adjusted to precipitate the primary crystals of the first element, and while maintaining the temperature, the second element is diffused outward to grow the primary crystals. That is, by satisfying the above-mentioned Equations (1) and (2), a chemical potential gradient of the second element is formed between the first portion 11 and the intermetallic compound formation layer 3 to be turned into the second portion 12, and the outward diffusion of the second element into the second portion 12 through the barrier layer 4 proceeds by an isothermal process. The concentration of the first element increases due to the outward diffusion of the second element, and when the first element becomes supersaturated, the first element precipitates as primary crystals in the liquid phase and the primary crystals begin to grow. Then, as the outward diffusion of the second element further proceeds, the ratio of the first element in a crystal state to the first element and the second element in the liquid phase state in the first portion 11 increases, and crystal growth proceeds.

Figure 3:
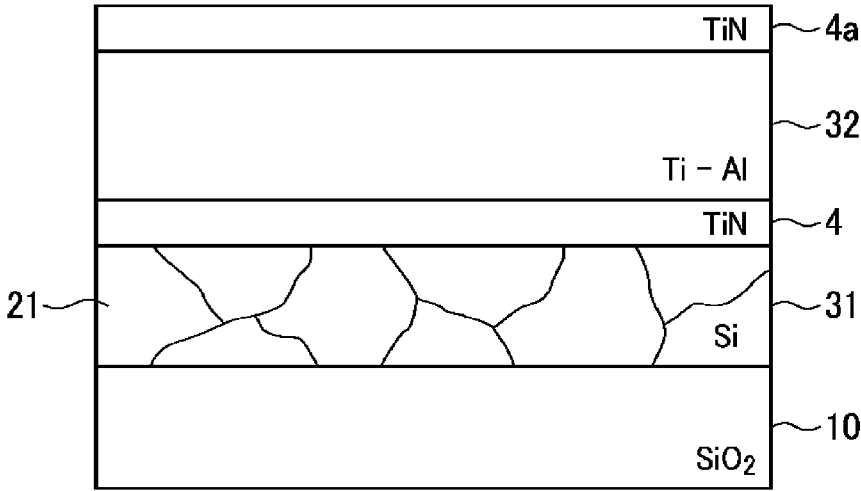
FIG. 3 is a cross-sectional view illustrating a conductive member having large crystal grains of the first element obtained by outwardly diffusing the second element from the first portion in the structure of FIG. 1.

It is noted that the outward diffusion of the second element is a rate-controlling process of the crystal growth process of the first element. Therefore, it is possible to design the crystal grain size by controlling the crystal growth due to the outward diffusion of the second element by the material (the diffusion rate and density of the second element), the film thickness, or the process temperature (constant) of the barrier layer 4. Finally, as illustrated in FIG. 3, the first portion 11 is turned into the conductive member 31 having large crystal grains 21 of the first element. When the first element is a semiconductor material such as Si or Ge, the conductive member 31 may be applied as a channel of a semiconductor device. As the second element is introduced to form a metal component, the intermetallic compound formation layer 3 is transformed into an intermetallic compound layer 32.

Figure 4:
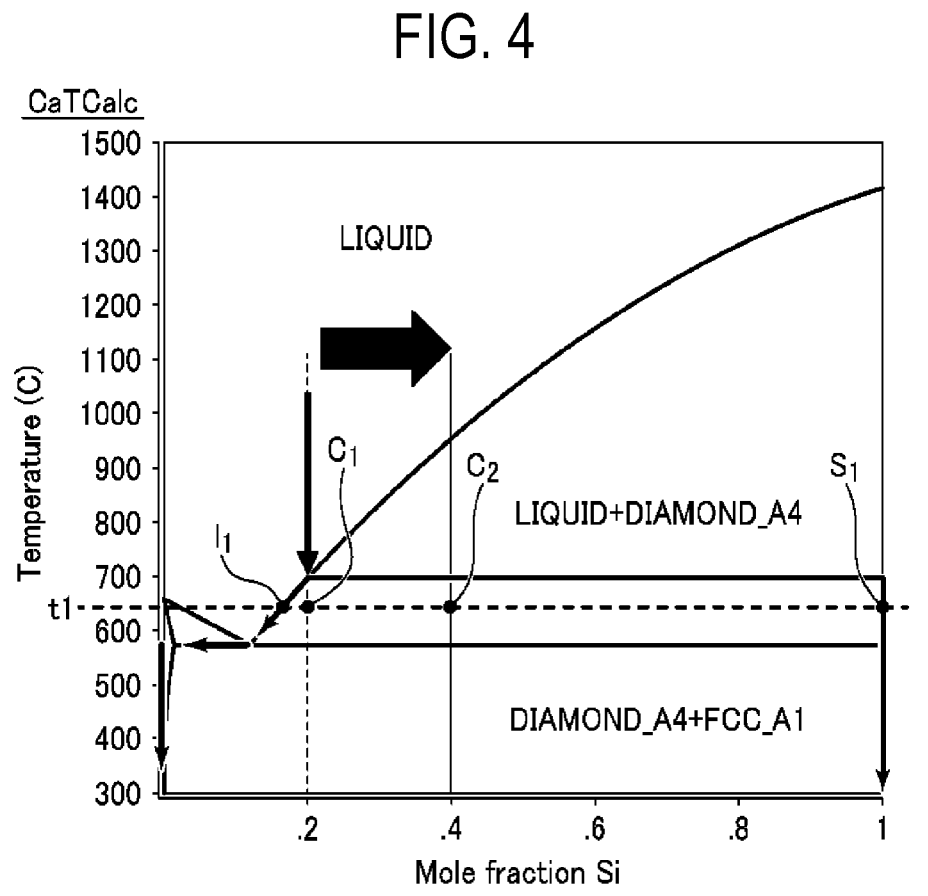

As a specific example, the case where the first element is Si and the second element is Al will be described. As illustrated in the binary state diagram of FIG. 4, in the composition ($C_1$) of 20 mole % Si-80 mole % Al, the temperature at which the primary crystals is precipitated is 700 degrees C., and when the temperature is t1 between 600 and 700 degrees C., the mole ratio of the liquid phase/solid phase in the composition $C_1$ may be expressed as solid phase: liquid phase=$l_1 C_1$:$S_1 C_1$ by using l1 and Si in the figure.

In a case where the outward diffusion of the second element further proceeds at the temperature t1 and the composition of Si changes from $C_1$ to $C_2$ very slowly during the solidification process, the mole ratio of the liquid phase/solid phase becomes solid phase: liquid phase=$l_1 C_2$:$S_1 C_2$, and the ratio of the crystal state to the liquid phase increases from $l_1 C_1$ to $l_1 C_2$. As a result, crystal growth proceeds, and finally, polycrystalline silicon having large crystal grains is formed as the conductive member 31.

Figures 5, 6:
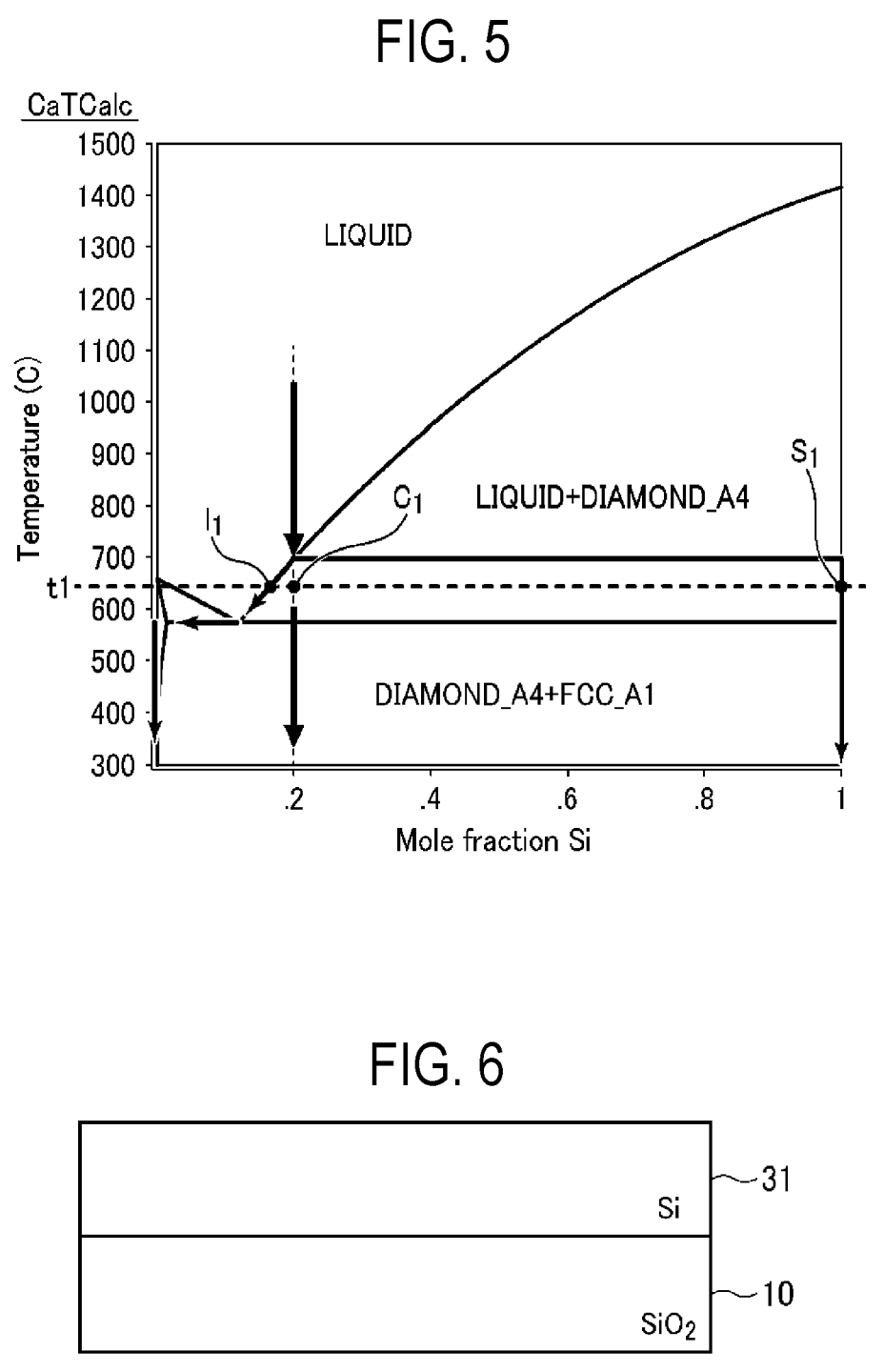

When Si is grown into crystals in the cooling process from a liquid phase temperature, the number of crystal precipitates is determined by "composition" and "temperature," and the crystal growth is determined by "cooling rate." For example, in the case of a Si—Al system, as shown in the binary state diagram of FIG. 5, in the composition ($C_1$) of 20 mole % Si-80 mole % Al, after the primary crystals are precipitated at 700 degrees C., the primary crystals are cooled at a desired cooling rate to be grown into crystals. Therefore, as described above, since the elaborate and precise temperature control in the substrate plane is performed and two phases of solid and liquid are formed in the cooling process, it is difficult to obtain flat crystals having a uniform composition.

In contrast, in the present embodiment, since cooling is not required, the elaborate and precise temperature control may not be performed, and the crystal growth of the first element are controllable by controlling the outward diffusion of the second element. Thus, it is possible to easily enlarge the grain size of crystal grains with excellent controllability.

As described above, when the process of forming the conductive member 31 by the reaction of the second element and the third element at the process temperature is completed, the temperature is lowered to 300 degrees C. or lower, and as shown in FIG. 6, the barrier layers 4 and 4a and the intermetallic compound layer 32 on the conductive member 31 are removed and the conductive member 31 remains. When the first element is a semiconductor material, the remaining conductive member 31 may be used as it is as a channel. The film thickness of the conductive member 31 at this time is, for example, about 4 to 5 nm.

Figure 7:
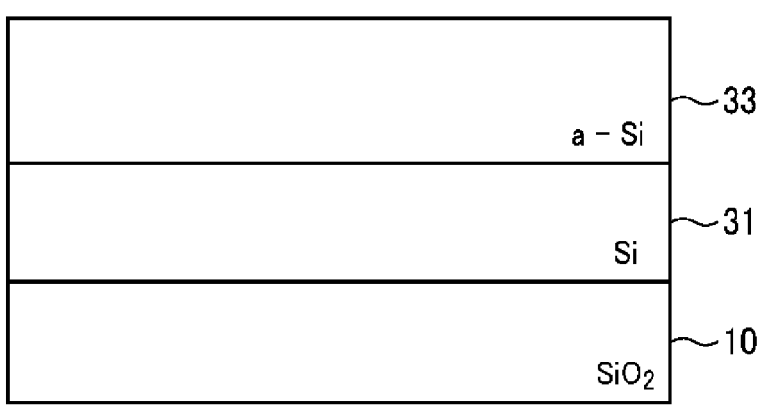
FIG. 7 is a view for explaining a process in which an amorphous conductive layer is formed on the conductive member of FIG. 6 and subjected to solid-phase epitaxial growth to form a thicker conductive layer as a whole.
Figure 7:
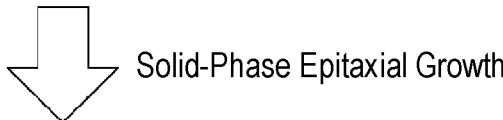
Figure 7:
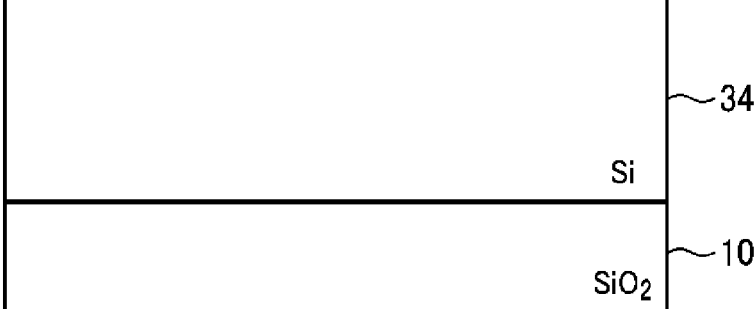

As illustrated in FIG. 7, by using a conductive member 31 having large crystal grains as a template, an amorphous conductive layer 33 containing the first element may be formed on the conductive member 31 and solid-phase epitaxial growth may be performed thereon, such that a thicker conductive member 34 as a whole may be obtained. That is, by solid-phase epitaxial growth, the amorphous conductive layer 33 is turned into crystals to which the large crystals of the conductive member 31 of the template are transferred, such that a thicker conductive member 34 as a whole may be obtained. When the first element is a semiconductor material, it is possible to obtain a thicker channel by such a method.

When the first element is Si, the amorphous conductive layer 33 is, for example, $n^+$-doped a-Si, and in this case, the conductive member 34 is n-Si. The film thickness of the amorphous conductive layer 33 is, for example, about 3 to 10 nm. In this case, with respect to the conductive member 31 of 4 to 5 nm, the film thickness of the thick conductive member 34 after solid-phase epitaxial growth will be about 7 to 15 nm. The temperature of solid-phase epitaxial growth may be 600 degrees C. or higher in the case of Si. From the viewpoint of suppressing nucleation from the site existing above, the temperature may be less than 800 degrees C.

In the present embodiment, the film thickness of the first portion 11 is set depending on the thickness of the conductive member 31 to be obtained. The thickness of the intermetallic compound formation layer 3 is appropriately set depending on the amount of the second element to be diffused from the first portion 11 to the intermetallic compound formation layer 3. The thickness of the barrier layer 4 is set to a thickness that is capable of suppressing and controlling the diffusion of the second element from the first portion 11 at an appropriate diffusion rate.

When the first element is Si, the second element is Al, the third element is Ti, and the barrier layers 4 and 4a are TiN, the film thickness of the first portion 11 may be in the range of 10 to 50 nm, for example, 15 nm. The thickness of the intermetallic compound formation layer 3 may be in the range of 20 to 100 nm, for example, 20 nm. The thickness of the barrier layer 4 may be in the range of 3 to 15 nm, for example, 3 nm, and the thickness of the barrier layer 4a may be in the range of 5 to 50 nm, for example, 5 nm. In FIGS. 1 to 3, 6 and 7, for convenience, the element symbols in the above-described specific examples are given to respective layers.

Second Embodiment

Next, a second embodiment will be described. In the second embodiment, a member obtained by adding, to the first element, a fourth element having a melting point lower than the melting point of the first element and forming a complete solid solution with the first element is used as the conductive member. That is, the fourth element satisfies the following Equation (3) with respect to the first element.

$$E_{14}-(E_{11}+E_{44}/2)=0 \tag{3}$$

$E_{14}$ is a bond energy between the first element and the fourth element, $E_{11}$ is a bond energy between the first elements, and $E_{44}$ is a bond energy between the fourth elements. Equation (3) means that there is no interaction between the first element and the fourth element.

Figure 8:
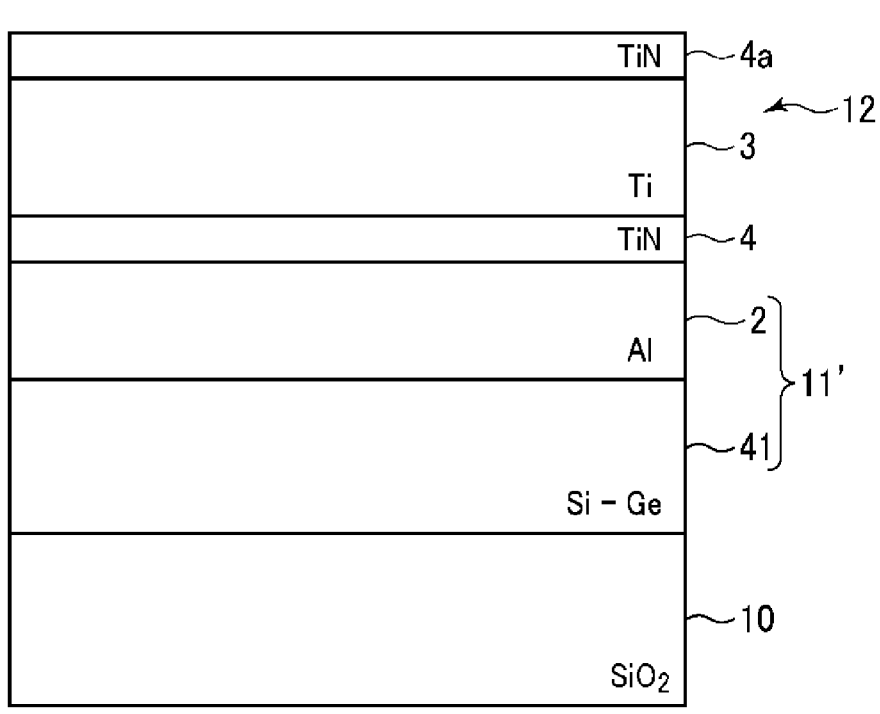
FIG. 8 is a cross-sectional view illustrating an example of a structure used in a method of forming a conductive member according to a second embodiment of the present disclosure.

FIG. 8 is a cross-sectional view illustrating an example of a structure used in a method of forming a conductive member according to the second embodiment of the present disclosure. In the present embodiment, instead of the conductive layer 1 of the structure of FIG. 1, a conductive layer 41 in which the fourth element is added to the first element, which constitutes the conductive member to be obtained, is used. A metal layer 2 is formed on the conductive layer 41, such that a first portion 11' containing the first element, the fourth element, and the second element is formed by the conductive layer 41 and the metal layer 2. The intermetallic compound formation layer 3 and the barrier layers 4 and 4a, which correspond to the second portions 12, are the same as the structure illustrated in FIG. 1 of the first embodiment of the present disclosure.

As the first element and the fourth element, which constitute the conductive layer 41, for example, Si and Ge, which are semiconductor materials, may be used.

Figure 9:
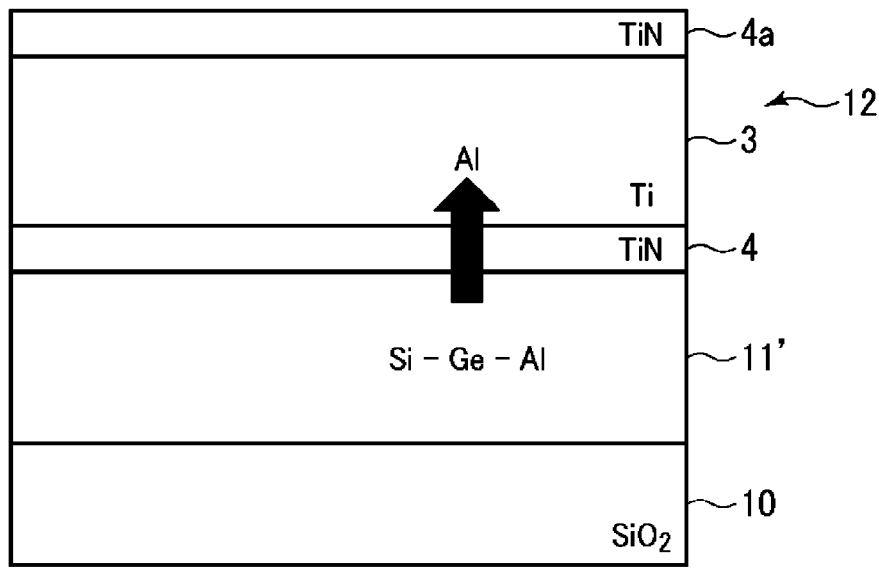
FIG. 9 is a cross-sectional view illustrating a state in which a phase of a first portion of the structure of FIG. 8 is a liquid phase.

In the present embodiment, the temperature at which the first element, the fourth element, and the second element are in a liquid phase is set, and as illustrated in FIG. 9, the conductive layer 41 and the metal layer 2 are melted to bring the first portion 11' into a liquid phase state, then the process temperature (the temperature of the substrate) is adjusted to precipitate the primary crystals containing the first element and the fourth element, and while maintaining the temperature, the second element is diffused outward to grow the primary crystals. Then, as in the first embodiment, the crystal grains are grown by an isothermal process so that the crystal grains grow to a desired size, and an excess portion is removed when the process is completed. As a result, as illustrated in FIG. 10, a conductive member 61 having large crystal grains 51 containing the first element and the fourth element is finally formed. When the first and fourth elements are Si and Ge, the conductive member 61 is silicon germanium (SiGe).

In the present embodiment, since it is possible to lower the melting point by using the conductive member 61 to which the fourth element having a melting point lower than that of the first element is added to the first element, and thus it is possible to lower the process temperature. The advantage of such lowering of the process temperature is that since the outward diffusion of the second element is suppressed by the lowering of the temperature to allow the crystallization process of the first element to proceed more slowly, crystal grains may be made larger. In FIGS. 8 to 10, for convenience, the element symbols in the above-described specific examples are given to respective layers.

Third Embodiment

Figure 11:
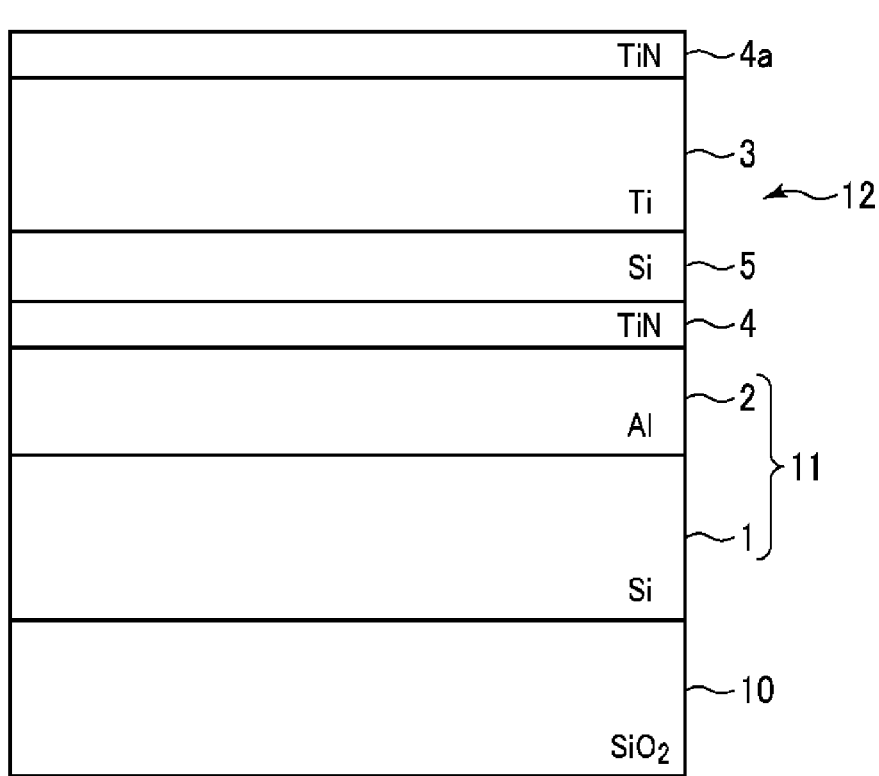
FIG. 11 is a cross-sectional view illustrating an example of a structure used in a method of forming a conductive member according to a third embodiment of the present disclosure.

Next, a third embodiment of the present disclosure will be described. FIG. 11 is a cross-sectional view illustrating an example of a structure used in a method of forming a conductive member according to the third embodiment. In the present embodiment, in the structure of the first embodiment, between the first portion 11 and the intermetallic compound formation layer 3 which is the second portion 12, more specifically, between the barrier layer 4 and the intermetallic compound formation layer 3, a diffusion suppression layer 5 that suppresses the outward diffusion of the first element is formed. When the conductive layer 1 and the metal layer 2 are melted to bring the first portion 11 into a liquid phase state, and then the process temperature (the temperature of the substrate) is set to diffuse the second element outward to the second portion 12, the first element may also diffuse outward. The diffusion suppression layer 5 has a function of suppressing such outward diffusion of the first element. As the diffusion suppression layer 5, a layer containing the first element may be used. For example, when the first element is Si, a Si film may be used as the diffusion suppression layer 5.

<Other Applications>

Although the embodiments of the present disclosure have been described above, it should be considered that the embodiments disclosed herein are exemplary in all respects and are not restrictive. The above embodiments may be omitted, replaced, or modified in various forms without departing from the scope and gist of the appended claims.

For example, in the above-described embodiments, the semiconductor materials are used as the first element and the fourth element, and the conductive member is used as the channel of a semiconductor device. However, the first element and the fourth element are not limited to the semiconductor materials and may be other conductive materials, and the conductive member is not limited to the channel of a semiconductor device.

According to the present disclosure, there are provided a method of forming a conductive member and a method of forming a channel, which are capable of easily enlarging the grain size of crystal grains with excellent controllability.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a conductive member, the method comprising:

forming, on a substrate, a first portion by laminating a conductive layer containing a first element and a metal layer containing a second element, which causes an eutectic reaction with the first element, and forming a second portion on the metal layer to form an intermetallic compound, the second portion being constituted by an intermetallic compound formation layer containing a third element that reacts with the second element, which is diffused into the second portion;

precipitating primary crystals of the first element by adjusting a temperature of the substrate after bringing the first portion into a liquid phase state;

growing crystal grains of the first element from the precipitated primary crystals by diffusing the second element from the first portion into the second portion, through a chemical potential gradient of the second element between the first portion and the second portion, to increase a ratio of the first element in a crystal state to the first element and the second element in the liquid phase state in the first portion while maintaining the temperature of the substrate at the same temperature; and turning the first portion, after the diffusion of the second element into the second portion is completed, into the conductive member having the crystal grains of the first element.

2. The method of claim 1, wherein the first element is a semiconductor material.

3. The method of claim 2, wherein the first element is silicon.

4. The method of claim 3, wherein the second element is aluminum, and the third element is titanium.

5. The method of claim 2, wherein the first element is germanium.

6. The method of claim 1, wherein a fourth element, which has a lower melting point than the first element and forms a complete solid solution with respect to the first element, is added to the first portion, and the fourth element is added to the first element in the conductive member.

7. The method of claim 6, wherein the first element and the fourth element are semiconductor materials.

8. The method of claim 7, wherein the first element is silicon, and the fourth element is germanium.

9. The method of claim 1, wherein a barrier layer serving as a barrier for the second element is provided between the first portion and the second portion, and the barrier layer suppresses and controls the diffusion of the second element into the second portion.

10. The method of claim 9, wherein the barrier layer is titanium nitride.

11. The method of claim 1, further comprising:

removing a portion existing above the conductive member after turning the first portion into the conductive member.

12. The method of claim 11, wherein, after removing the portion existing above the conductive member, an amorphous conductive layer containing the first element is formed on the conductive member, and crystal grains of the conductive member are transferred to the amorphous conductive layer by solid-phase epitaxial growth such that the conductive member becomes thicker.

13. The method of claim 1, wherein a diffusion suppression layer that suppresses diffusion of the first element into the second portion is provided between the first portion and the second portion.

14. The method of claim 13, wherein the diffusion suppression layer contains the first element.

* * * * *